United States Patent [19]
Buckingham et al.

[11] Patent Number: 5,389,830
[45] Date of Patent: Feb. 14, 1995

[54] CLOCK GENERATION

[75] Inventors: Keith Buckingham; Robert J. Simpson, both of Bristol, United Kingdom

[73] Assignee: Inmos Limited, Bristol, United Kingdom

[21] Appl. No.: 933,679

[22] Filed: Aug. 24, 1992

Related U.S. Application Data

[62] Division of Ser. No. 542,320, Jun. 22, 1990, Pat. No. 5,243,597.

[30] Foreign Application Priority Data

Jul. 7, 1989 [GB] United Kingdom ............... 8915583

[51] Int. Cl.$^6$ ............................................. H03K 5/159
[52] U.S. Cl. ......................... 327/291; 327/116; 327/258
[58] Field of Search ................ 328/55, 60; 307/269, 307/603, 605, 606

[56] References Cited

U.S. PATENT DOCUMENTS

| | | | |
|---|---|---|---|
| 3,631,464 | 12/1971 | Dahlberg | 340/347 |
| 3,995,119 | 11/1979 | Pachynski, Jr. | 179/15 |
| 4,316,148 | 2/1982 | Kaminski | 328/55 |
| 4,613,775 | 9/1986 | Dick | 307/480 |
| 4,691,124 | 9/1987 | Ledzius et al. | 307/303 |
| 4,899,071 | 2/1990 | Morales | 328/55 |

FOREIGN PATENT DOCUMENTS

| | | | |
|---|---|---|---|
| 0136207 | 4/1985 | European Pat. Off. | G01R 31/28 |
| 0219604 | 4/1987 | European Pat. Off. | H03L 7/00 |
| 0274606 | 7/1988 | European Pat. Off. | |
| 0346896 | 12/1989 | European Pat. Off. | |
| 85/02275 | 5/1985 | WIPO | G06F 1/04 |

OTHER PUBLICATIONS

I. Hernandez, Jr., "Frequency Multiplier Using Delay Cicuits," *IBM Technical Disclosure Bulletin,* vol. 26, No. 3A Aug., 1983.

Bult et al., "A CMOS Analog Continuous-Time Delay Line with Adaptive Delay-Time Control", *IEEE J. of Solid State Circuits,* vol. 23, No. 3, pp. 759–761 (Jun. 1988).

*Primary Examiner*—Andrew M. Dolinar
*Attorney, Agent, or Firm*—Edward D. Manzo; Ted K. Ringsred

[57] ABSTRACT

There is described clock generation circuitry comprising: a plurality of sequentially connected delay devices, a first one of which is coupled to receive the first clock signal, each delay device being operable to produce a trigger signal and an output signal at a predetermined time after receiving a trigger signal from the previously connected delay device; control circuitry common to said delay devices for controlling said predetermined time interval; and output circuitry coupled to receive the output signals of the delay devices to produce therefrom said second clock signal.

13 Claims, 5 Drawing Sheets

CLOCK GENERATION

RELATED APPLICATIONS

The present application is a division of U.S. Ser. No. 542,320, filed Jun. 22nd, 1990, now U.S. Pat. No. 5,243,597, and assigned to the present assignee.

FIELD OF THE INVENTION

This invention relates to clock generation and particularly to the generation of a clock signal on an integrated circuit.

BACKGROUND TO THE INVENTION

There have been recently dramatic increases in the performance of integrated circuit graphic systems, resulting in the requirement for ever increasing data rates. Data rates in mainstream graphics workstations have increased from 25 MHz to over 100 MHz, and future increases are probable.

Currently, information destined for screen output is stored in a block of memory called a frame store which periodically outputs its information in a serial fashion at a rate called the pixel dot rate. This serial information can be manipulated by graphics hardware at the pixel dot rate and is ultimately converted by a digital-to-analogue converter (DAC) to analogue voltages which can control the electron guns in a cathode ray tube (CRT).

To utilise readily available and cheap memory technology which cannot operate at such high speeds, the aforementioned frame store is split up into a plurality of smaller frame stores which operate more slowly and in parallel. Pixel data from the frame stores is outputted in parallel streams down a pipeline. These pixel streams are combined by a multiplexor into one high speed serial stream, upstream of the DAC.

Generally such combination involves a high speed clock to control this multiplexor. Any graphics hardware required to operate on the high speed serial pixel stream will also have to be controlled by this high speed clock. It is known to provide the multiplexor combining the multiple pixel stream on the same silicon chip as a high speed sequential graphics device even though an external high speed clock at the pixel dot rate frequency has also had to be supplied to control both. This produces a synchronisation problem which is difficult to solve, because the low rate data entering the graphics device is not correlated with the high speed clock. Even if the low rate data is controlled by a signal derived from the high speed clock, for example by using a frequency divider, delays are such that at these high frequencies this has to be viewed as uncorrelated. In addition to this problem extra costs are incurred to generate the high speed clock.

More generally, it is often required to take into a silicon chip several data streams at lower frequencies. Once combined into a single stream this data can be used as the input to another part of the chip. Both stages require the input of an external clock which is at the highest frequency that occurs on the chip. This is expensive and produces synchronisation problems.

It is an object of the present invention to solve the problem of synchronising incoming data at a low rate with an integrated circuit processing device utilising that data at a higher rate.

SUMMARY OF THE INVENTION

According to the present invention there is provided clock generation circuitry for providing from a first clock signal a second clock signal at a different rate, the circuitry comprising: a plurality of sequentially connected delay devices, a first one of which is coupled to receive the first clock signal, each delay device being operable to produce a trigger signal and an output signal at a predetermined time interval after receiving a trigger signal from the previously connected delay device; control means common to said delay devices for controlling said predetermined time interval; and output means coupled to receive the output signals of the delay devices to produce therefrom said second clock signal.

It will be appreciated that the term clock signal is used to denote any periodic function and is not restrictive of the application to which such a function might be put.

This clock generation circuitry is particularly suitable for use in an integrated circuit comprising: a multiplexor connected to receive incoming data at a first rate and controllable by a high rate clock signal to output that data serially at a second, higher rate; a processing device coupled to receive data output from the multiplexor at the higher rate and controllable by a high rate clock signal to process that data; and clock generation circuitry connected to receive a first clock signal at said first rate and operable to produce therefrom said high rate clock signal to be supplied to the processing device and to the multiplexor.

By utilising clock generation circuitry which is part of the integrated circuit device to produce the high rate clock signal from the first clock signal used to regulate the incoming data it is possible to ensure that the operation of the processing device will be synchronised to the data rate of the data which it is processing.

Thus, this invention relates in its preferred embodiment to the provision on chip of a multiplexor to take in slower parallel streams, a higher speed processing device, and a clock acceleration circuit to take in an input of a lower frequency and generate the required high frequency clock to control the rest of the chip. To ensure synchronisation, the lower frequency input used is the same frequency used to control the incoming data streams. Hence no such high frequency is now required to be supplied from an external source. Because all high frequency signals only exist within the bounds of this one chip (with the exception of the output which only goes straight to a CRT) then all timing and synchronisation problems can be solved by the chip designer, not the system designer.

A user of the integrated circuit, which will be sold in the form of a chip, need only provide a single, low rate clock and does not heed to concern himself with the clock speed and synchronisation in the integrated circuit. This offers considerable attraction to purchasers of integrated circuit chips.

Preferably the control means is connected in a feedback loop so as to be responsive to an error signal resulting from comparison of the first clock signal with the output signal of the last connected delay device. By incorporating a control system in this way, the output signals of the connected delay devices can be made to occur in a regular fashion between consecutive pulses of the first clock signal.

The output means can be arranged to provide two second clock signals at the same frequency but in antiphase.

Circuitry of this type lends itself well to manufacture in an integrated circuit and obviates the need for an externally provided high rate clock signal. Effectively a first order control system has been created by replacing the voltage controlled oscillator of a phase locked loop with a triggered chain of events. This is easier to control yet stable over a large period of time and consequently more resistant to noise.

The delay devices can be conventional delays or monostables of which numerous examples are known. A preferred delay device however is one devised by the present inventor and comprising a timing circuit and a control circuit, the timing circuit comprising a controllable switch element for receiving a reset signal, capacitive means connected to be charged up when said controllable switch element is in a first state, and comparator means connected to receive as a first input signal the voltage across the capacitive means, and as a second input signal a control voltage, and producing as an output a timing signal in dependence on said first and second input signals and the control circuit being connected to receive said timing signal and to provide in response thereto the trigger signal of the delay device and the said reset signal. The control voltage is conveniently derived from said control means of the clock generation circuitry.

Such a monostable provides a greater dynamic range than known delay devices. This is usually limited in practice by the gain of a circuit being too high at some point in its characteristic, causing a sensitivity to noise under particular circumstances which is hard to suppress. Here this has been overcome by making the gain (expressed as the change in said predetermined time interval for a certain change in said control voltage), as constant as possible between the two end points of the required dynamic range. This ensures that the gain is no higher than it needs to be to achieve the required minimum and maximum time intervals. In the preferred embodiment this is achieved by not using, in contrast to conventional delay devices, a low biased MOSFET to limit any currents or to add loads to certain nodes to perform the control of the delay device.

The number of selected delay devices affects the multiplication factor by which the second clock signal differs from the first clock signal. The clock generation circuitry can be manufactured with p delay devices with means for selecting n of the p delay devices (where n≦p) for use in generation of the second clock signal. In this way it is unnecessary to decide at the manufacturing stage how many delay devices are required for any specific application.

Where the number p of delay devices is a known, even number, the output means for producing the second clock signals can be designed as a fixed logic array without too much difficulty. However, when an unknown number n of delay devices is to be utilised a more sophisticated arrangement is required. According to one embodiment of the present invention said output means comprises a plurality of generation units connected respectively to receive the output signals of the p delay devices, the generation units being individually connectable to a common output line and each generation unit having three states: a neutral state in which the output line is examined; a negative drive state in which a negative going pulse is driven onto the output line; and a positive drive state in which a positive going pulse is driven onto the output line, the second clock signal thereby being generated on the output line as follows: prior to receipt of a trigger signal by its associated delay device a generation unit is in its neutral state and when a delay device receives a trigger signal the generation unit associated with that delay device responds to the output signal of that delay device to adopt one of its positive and negative drive states in dependence on the state of the second clock signal just prior to the change of state of that generation unit.

The generation units can also be individually connectable to a second common output line and arranged so that in their negative drive states a positive going pulse is driven onto the second common output line and in their positive drive states a negative going pulse is driven onto the second common output line thereby to generate a clock signal in antiphase to said second clock signal.

For a better understanding of the present invention, and to show how the same can be carried into effect, reference will now be made, by way of example, to the accompanying drawings.

DESCRIPTION OF THE PREFERRED EMBODIMENT

Figure 1:
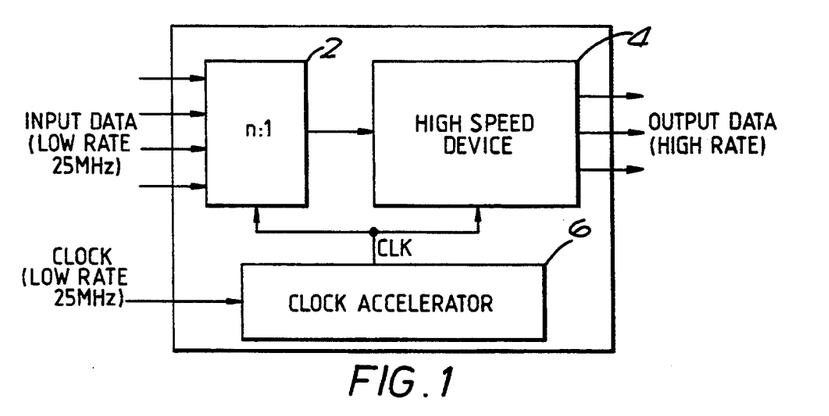
FIG. 1 is a schematic diagram showing the principle of on chip clock generation.

FIG. 1 shows components implemented on a single integrated circuit device or chip. A multiplexor 2 receives input data at a normal clock rate, for example 25 MHz. The incoming data latched by a low rate clock signal, is multiplexed into a high rate data stream to be passed to a high speed device 4, for example a graphics processing device. Operation of the multiplexor 2 and the high speed device 4 is controlled by an on chip clock accelerator 6 which receives the low rate clock signal and generates therefrom a high rate clock signal CLK synchronised with the low rate clock. The signal CLK comprises two signals in antiphase, CLK1 and CLK2.

Figure 2:
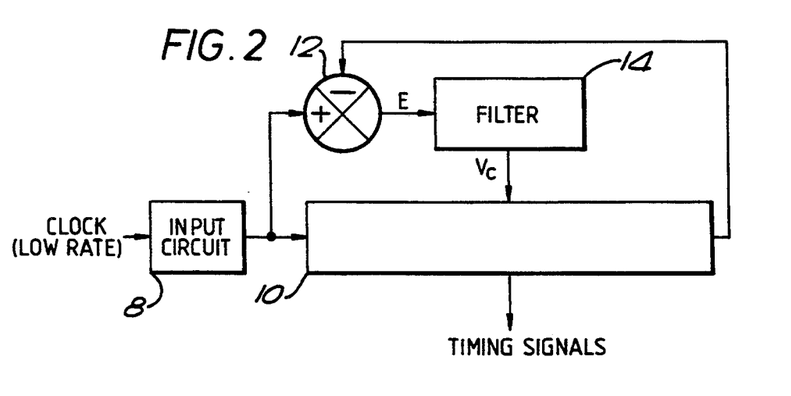
FIG. 2 is a schematic diagram showing the principle of an embodiment of the present invention using feedback.

The basic construction of the clock accelerator is described with reference to FIG. 2. It comprises an input circuit 8 for receiving the low rate clock signal and a plurality of sequentially connected delay devices which are represented in FIG. 2 by the single box 10 connected to the input circuit 8. The output of the sequentially connected delay devices 10 is fed to an error generator 12 which also receives the low rate clock signal from the input circuit 8. The output signal from the error generator 12 is an error signal E which is fed to a loop filter 14 which integrates it to provide a common control voltage Vc for controlling the plurality of delay devices 10. Operation of the circuit will become clearer as each individual component is described in the following.

Figure 3:
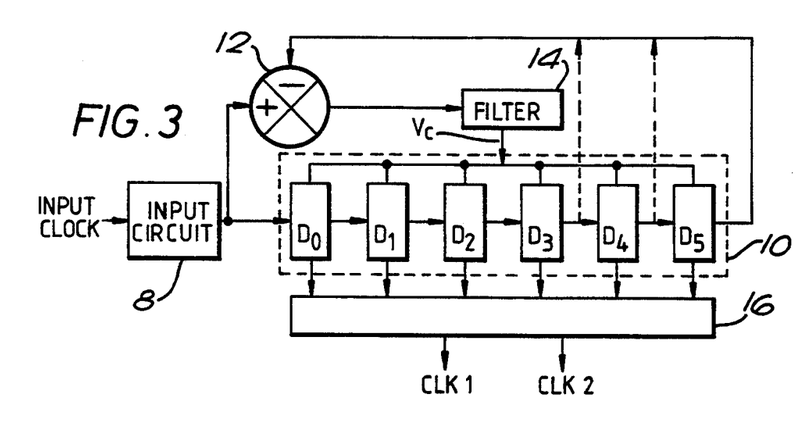
FIG. 3 is a more detailed diagram of the embodiment of the present invention shown in FIG. 2.

Referring now to FIG. 3 the plurality of delay devices D0 to D5 in the box 10 are shown individually. The first delay device D0 is connected to receive the input clock signal from the input circuit 8. The next delay device D1 and subsequent delay devices D2 to D5 are connected in sequence to the first delay device D0. Each delay device acts to generate an output signal at a predetermined time interval after the receipt of a trigger signal. The output signal of each delay device D0 to D5 is received by an output means in the form of a buffer 16 which generates two antiphase clock signals in a manner to be described hereinafter. The detailed operation of the delay devices will also be described in more detail below. However, referring to FIG. 4, it is noted here that the input signal for the first delay device acts as a trigger signal to cause the first delay device to produce a trigger signal after a predetermined time interval t, in the form of a falling edge. The falling edge triggers the next delay device D1 which acts similarly to produce an output signal after time t. As will become clearer in the following, in the described embodiment the output signal of each delay device is the inverse of its output trigger signal. This is repeated to the last delay device D5. The time intervals t, are controlled by a common voltage signal Vc from the filter 14. The trigger signal output by the last delay device D5 is compared with the next incoming clock pulse, and any phase error E will influence the filter to alter the control voltage Vc and hence the time intervals. In this way, a series of pulses synchronised to the incoming clock signal and of equal length can be produced.

It is important to note that the time interval, t, is the same for each delay device, achieved by supplying a common control signal, voltage Vc, to all the delay devices. This is the basis of clock signal production to be described later.

Figure 5:
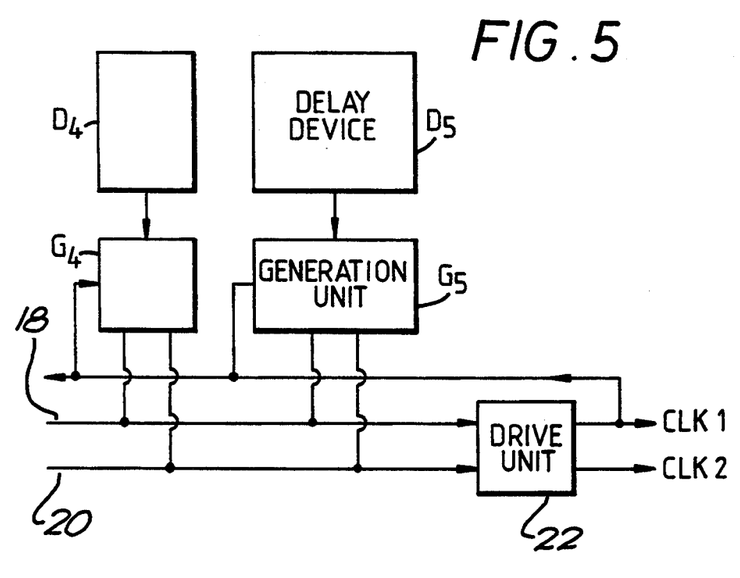
FIG. 5 is a schematic diagram of the generation units.

The buffer 16 comprises a plurality of generation units, a generation unit being associated with each respective delay device Do to D5. In the buffer each generation unit G0 to G5 is connected to drive two common output lines 18, 20 (see FIG. 5). The output lines 18, 20 feed a driving unit 22 from whence issue the antiphase clock signals CLK1, CLK2 on respective ones of the output lines 18, 20. Each generation unit G0 to G5 is also connected to examine the output signal CLK1. In FIG. 5, two delay devices D4, D5 are shown with their respective associated generation units G4, G5.

The circuit of FIG. 3 has six delay devices. However, it may be desirable to utilise only four or five of these, depending on the required acceleration factor of the clock signal. This is indicated diagrammatically by the dotted arrows in FIG. 3.

Where the number of delay devices is a known, even number, the output means 16 for producing the second clock signal could be designed as a fixed logic array without too much difficulty. However, when an unknown number of delay devices is to be selected, a more sophisticated arrangement is required, utilising the generation units discussed above. Each generation unit is connected to receive the output signal of its associated delay device and to drive appropriate signals onto the common output lines 18, 20. Each generation unit has three states: a neutral state in which the output signal CLK1 is examined; a first drive state in which a negative going pulse is driven onto one of the output lines and a positive going pulse is simultaneously driven onto the other output line; and a second drive state in which the pulses are reversed. The second clock signals are generated in the output lines as follows: prior to receipt of a trigger signal by its associated delay device a generation unit is in its neutral state examining CLK1. When a delay device receives a trigger signal the generation unit associated with that delay device responds to the output signal of that delay device to adopt one of its first and second drive states in dependence on the state of CLK1 just prior to the change of state of that generation unit. The length of each pulse is determined by the time interval t, of the delay devices.

Figure 6:
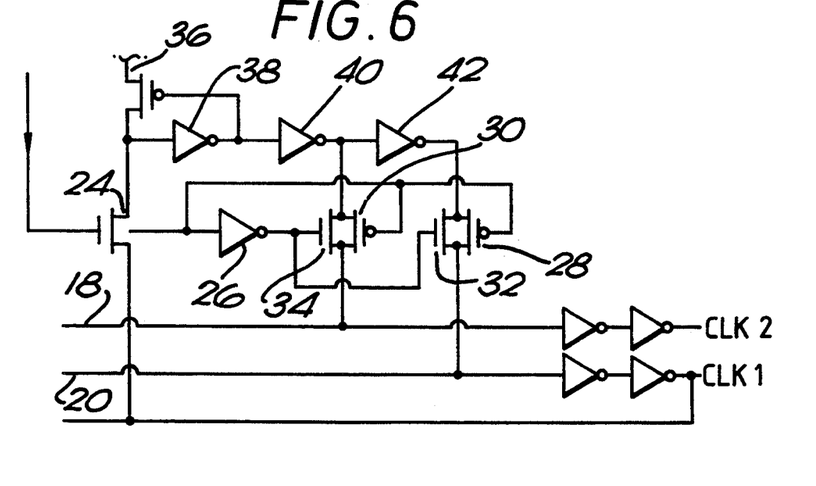
FIG. 6 is a circuit diagram of one generation unit.

The circuitry of each generation unit is shown in FIG. 6. An input n-channel transistor 24 is connected to receive at its gate the output signal of the delay device associated with the generation unit. The output signal is also fed to a first inverter 26 and to the gates of p-channel transistors 28, 30. The output of the first inverter 26 is connected to the gates of n-channel transistors 32, 34. Each p-channel transistor 28, 30 forms with a respective n-channel transistor 32, 34 a transmission gate. A p-channel transistor 36 is connected between a voltage supply and the drain of the input transistor 24, the gate of this transistor 36 being fed from the output signal of a second inverter 38 connected to the drain of the input transistor 24. The second inverter 38 feeds a third inverter 40 which in turn feeds a fourth inverter 42. The input of the transmission gate 30, 34 is connected to the output of the third inverter 40 and the input of the transmission gate 28, 32 is connected to the output of the fourth inverter 42. The output of the transmission gate 30, 34 is connected to one of the output lines 18 and the output of the transmission gate 28, 32 is connected to the other of the output lines 20. Finally, the source of the input transistor 24 is connected to examine one of the output signals CLK1.

Figure 4:
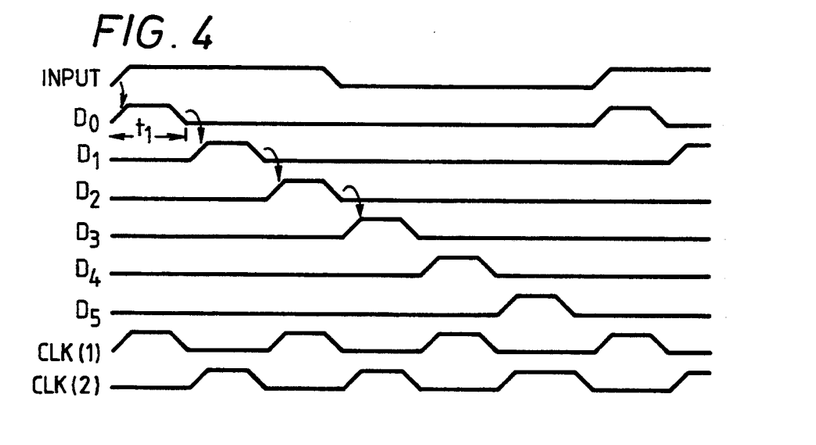
FIG. 4 is a timing diagram for the operation of the circuitry of FIG. 3.

It will be assumed for the purposes of the following explanation that the starting state is such that the clock signal CLK1 is high, its counterpart CLK2 is low and the delay device associated with the particular generation unit it is inactive; in other words, the signal applied to the input transistor 24 is high. In these circumstances, the input transistor 24 is "on", its drain (the input of inverter 38) follows the clock signal CLK1 and goes high, the output of the inverter 38 hence goes low, the output of the inverter 40 goes high and the output of the inverter 42 goes low. Due to the inverter 26, the transistors 32 and 34 are however "off". When the delay device associated with the generation unit becomes active and issues its output signal, which is the inverse of the falling edge trigger signal as described earlier, the input transistor 24 is turned "off" while the transistors 32 and 34 are turned "on". That is, the signals at the outputs of the inverters 40 and 42 are connected respectively to the output lines 18 and 20. As discussed above, the output of the inverter 40 is high and the output of the inverter 42 is low. Hence, the clock signal CLK1 goes low and its counterpart CLK2 goes high, i.e. the reverse of the states prior to the delay device going active. It is a particular advantage of this invention that two antiphase and perfectly synchronised clock signals are produced without any additional circuitry. That is, it is as easy to produce two antiphase clock signals as it is to produce one. These clock signals and their relationship to the signals produced by the delay devices are shown in FIG. 4.

Figure 7:
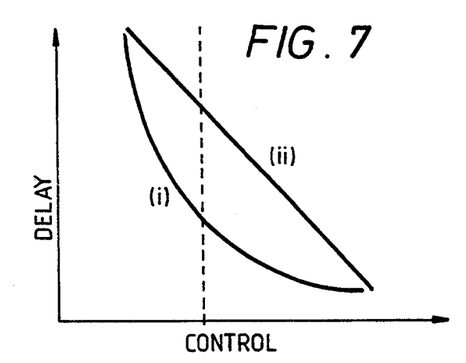
FIG. 7 is a graph showing the relationship between change in time interval and changes in the control voltage for different delay devices.
Figure 8:
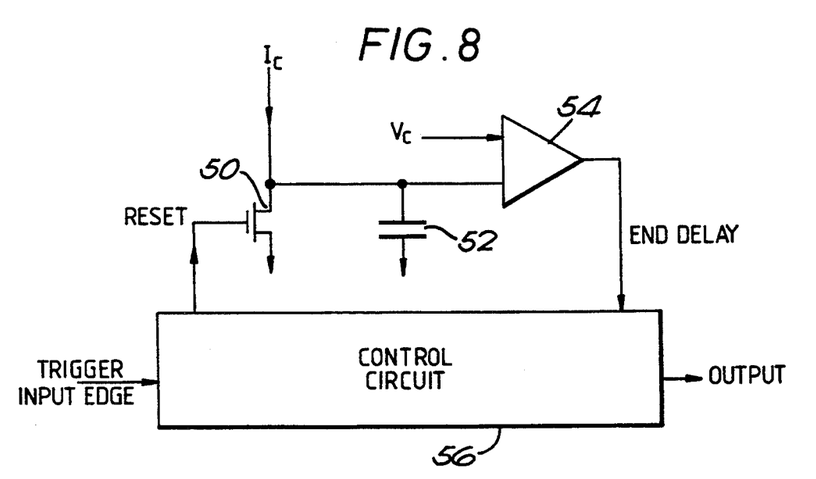
FIG. 8 is a circuit diagram of a delay device in accordance with one embodiment of the invention.

The individual delay devices will now be described. Although in principle any suitable delay device, such as a conventional monostable, could be used in the circuit of the present invention, such monostables generally rely on a low biased MOSFET (metal oxide semiconductor field effect transistor) to limit currents or add loads to certain nodes to perform the control of the monostables. Such techniques inherently involve exponential responses to the applied control signal with the result that the gain of the circuit is far too high under some operational conditions. This can be seen clearly in FIG. 7 where the graph (i) shows the delay/control characteristic for a typical monostable. In contrast, the graph (ii) shows the desirable delay/control characteristic, that is with a fixed gain. Although to the right hand side of the dotted line, the characteristic curve (i) is satisfactory, to the left of that line it is undesirable since it requires an extremely stable control for its operation. The characteristic curve (ii) is more tolerant of control conditions. One way of achieving a delay device which conforms more closely to the characteristic curve (ii) is shown in FIG. 8. The delay device has a timing circuit comprising a switch element in the form of an n-channel FET 50, a capacitor 52 connected to the drain of the transistor 50 and a comparator 54 having one input connected to receive the voltage developed across the capacitor 52 and the other input connected to receive the control voltage Vc. A constant current source (not shown) provides a fixed current Ic to the drain of the transistor 50. The delay device also includes a control circuit illustrated in FIG. 8 only by box 56, which is arranged to receive the trigger signal (inputEdge) for the delay device (the falling edge issued by the preceding delay device) and to produce an output signal which is fed to the associated generation unit. The control signal circuit also produces a reset signal for the transistor 50 and receives the output signal (endDelay) of the comparator 54. With the transistor 50 in the "off" state, the constant current Ic charges the capacitor 52 so that the voltage across the capacitor 52 increases linearly with time. As the voltage across the capacitor exceeds the control voltage Vc, the output of the comparator 54 will switch from low to high. It is an important feature of this arrangement that by using a fixed charging current, the increase in capacitor voltage with time will be as linear as the current is constant. The availability of a constant current serves to ensure the required linear delay response to the control voltage Vc. The low to high transition (endDelay) of the comparator 54 is fed to the control circuit 56 to produce the required output signals as will now be described.

Figure 9:
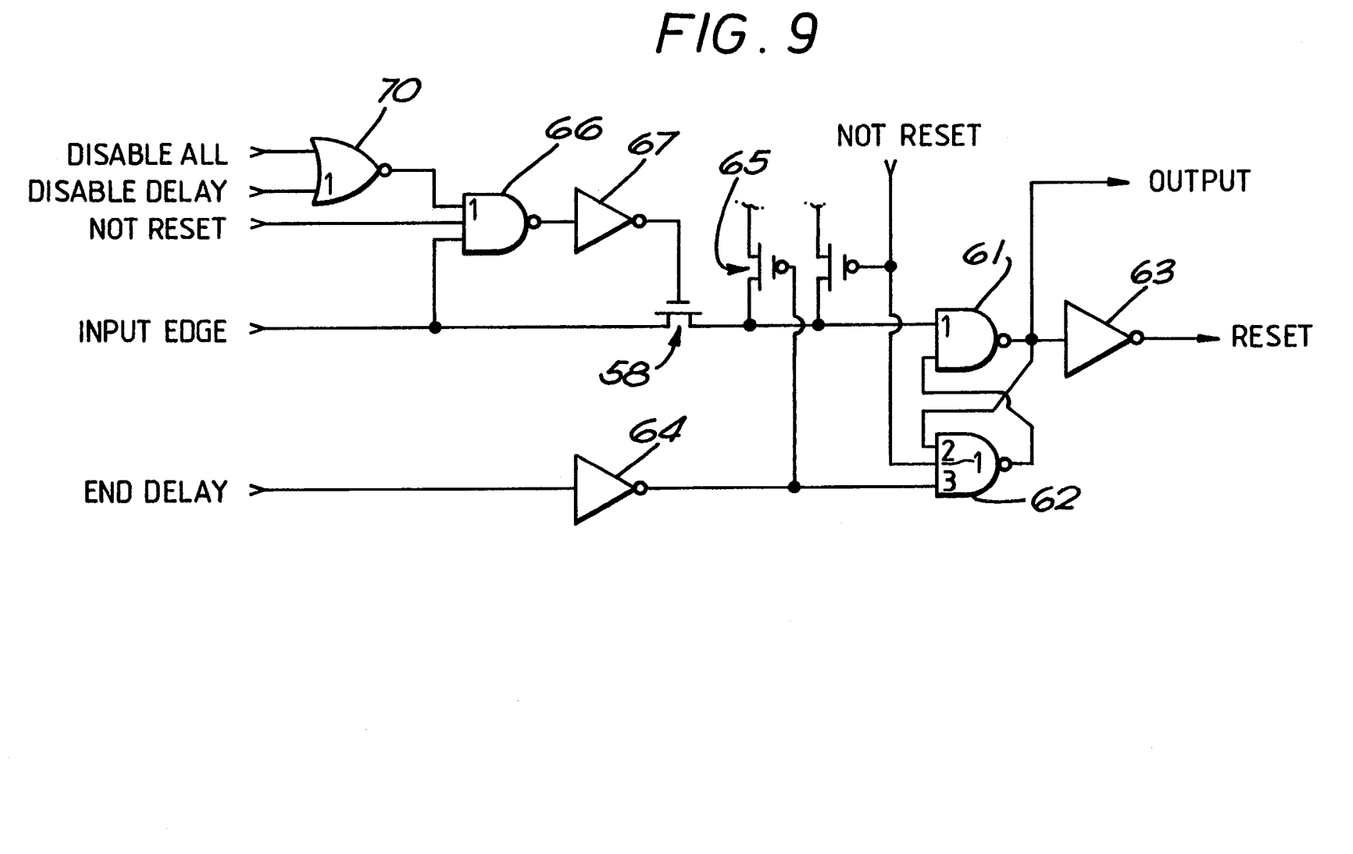
FIG. 9 is a circuit diagram of the control circuit of FIG. 8.

Details of the control circuit 56 are shown in FIG. 9. The control circuit is such that once it has become active it is insensitive to changes of its trigger signal but responds only to the endDelay signal from the comparator 54. Moreover, once the delay device has completed its timing operation and its output has once again gone low, it must not be immediately triggered by its input if that has remained low and not yet gone high. The control circuit comprises an FET transistor 58, the drain of which is coupled to receive the inputEdge signal for the delay device. The drain of the transistor is coupled to its gate by a NAND gate 66 sequentially connected to an inverter 67. The endDelay signal from the comparator 54 is fed to an inverter 64. The output of the inverter 64 is connected to the gate of a p-channel FET 65, the source of which is connected to one input of a NAND gate 61. This NAND gate 61 is cross-coupled with a second NAND gate 62 to form a flip-flop. The free input of the NAND gate 62 receives the output of the inverter 64. The output of the NAND gate 61 is inverted by an inverter 63 to provide the reset output for the transistor 50. The output of the NAND gate 61 is the output signal of the control circuit which serves to trigger the subsequent delay device. Setup circuitry in the form of a NOR gate 70 connected to one input of the NAND gate 66 is present to set the starting-up characteristics of the control circuit.

Assuming that the inputEdge signal is initially high and goes low, the NAND gate 66, inverter 67 and transistor 58 constitute an edge detector. The transistor 58 serves as a PASS gate to transfer the low signal onto the input of the NAND gate 61 before it is turned off by the output of the inverter 67 acting on its gate. As a result of the input of the NAND gate 61 going low, the output signal goes high and the reset signal goes low. If the endDelay signal is low, as should be the case, then both the inputs to the NAND gate 62 are high ensuring that its output is low so keeping the NAND gate 61 in the set state. When the endDelay signal goes high, the flip-flop comprising the NAND gate 61 and 62 will change state because both inputs to the NAND gate 61 will go high. In that situation, the output signal goes low and the reset signal goes high.

We claim:

1. Clock generation circuitry for providing from a first clock signal a second clock signal at a different rate, the circuitry comprising:
   a plurality of sequentially connected delay devices, a first one of which is coupled to receive the first clock signal, each delay device being operable to cause a trigger signal and an output signal to be produced at a predetermined time interval after receiving a trigger signal from the previously connected delay device;
   control circuitry operable to provide a control signal in common to said delay devices for controlling said predetermined time interval; and
   output circuitry coupled to receive the output signals of the delay devices to produce therefrom said second clock signal, wherein the output circuitry has a plurality of inputs for receiving respective ones of the output signals of the delay devices and is operable to change the state of its own output signal on receipt of each said output signal of the delay device.

2. Clock generation circuitry as claimed in claim 1, in which the control circuitry is connected in a feedback loop so as to be responsive to an error signal resulting from a comparison of the first clock signal with the trigger signal output by the last connected delay device.

3. Clock generation circuitry as claimed in claim 1 or 2 in which each delay device comprises analogue timing circuitry and digital control circuitry thereby to achieve a substantially linear response of the predetermined time interval to the control circuitry.

4. Clock generation circuitry as claimed in claim 3 in which the analogue timing circuitry comprises a controllable switch element responsive to a reset signal to change from a first to a second state, a capacitor connected to be charged up when said controllable switch element is in the first state, and a comparator connected to receive as a first input signal the voltage across the capacitor, and as a second input signal a control voltage from said control circuitry, and producing as an output a timing signal in dependence on said first and second input signals and the digital control circuitry being connected to receive said timing signal and to provide in response thereto the trigger signal of the delay device and the said reset signal.

5. Clock generation circuitry as claimed in claim 1 with p delay devices and means for selecting n of the p delay devices (where $n \leq p$) for use in generation of the second clock signal.

6. Clock generation circuitry for providing from a first clock signal a second clock signal at a different rate, the circuitry comprising:
- a plurality of sequentially connected delay devices, a first one of which is coupled to receive the first clock signal, each delay device being operable to cause a trigger signal and an output signal to be produced at a predetermined time interval after receiving a trigger signal from the previously connected delay device;
- control circuitry operable to provide a control signal in common to said delay devices for controlling said predetermined time interval; and
- output circuitry coupled to receive the output signals of the delay devices to produce therefrom said second clock signal, wherein the output circuitry for producing the second clock signal comprises a plurality of generation units connected respectively to receive the output signals of the delay devices, the generation units being individually connectable to a common output line and each generation unit having three states: a neutral state in which the output line is examined; a negative drive state in which a negative going pulse is driven onto the output line; and a positive drive state in which a positive going pulse is driven onto the output line, the second clock signal thereby being generated on the output line as follows: prior to receipt of a trigger signal by its associated delay device a generation unit is in its neutral state and when a delay device receives a trigger signal the generation unit associated with that delay device responds to the output signal of that delay device to adopt one of its positive and negative drive states in dependence on the state of the second clock signal just prior to the change of state of that generation unit.

7. Clock generation circuitry as claimed in claim 6 in which each delay device comprises analogue timing circuitry and digital control circuitry thereby to achieve a substantially linear response of the predetermined time interval to the control circuitry.

8. Clock generation circuitry as claimed in claim 7 in which the analogue timing circuitry comprises a controllable switch element responsive to a reset signal to change from a first to a second state, a capacitor connected to be charged up when said controllable switch element is in the first state, and a comparator connected to receive as a first input signal the voltage across the capacitor, and as a second input signal a control voltage from said control circuitry, and producing as an output a timing signal in dependence on said first and second input signals and the digital control circuitry being connected to receive said timing signal and to provide in response thereto the trigger signal of the delay device and the said reset signal.

9. Clock generation circuitry as claimed in claim 6 in which the control circuitry is connected in a feedback loop so as to be responsive to an error signal resulting from a comparison of the first clock signal with the trigger signal output by the last connected delay device.

10. A method of providing from a first clock signal a second clock signal at a different rate, the method comprising:
- supplying the first clock signal to a first one of a plurality of sequentially connected delay devices, each delay device being operable to produce a trigger signal and an output signal at a predetermined time after receiving a trigger signal from the previously connected delay device;
- controlling said predetermined time interval using control circuitry common to said delay devices; and
- supplying respective ones of the output signals of the delay devices to a plurality of inputs of output circuitry operable to produce therefrom said second clock signal by changing the state of its output signal on receipt of each said output signal of the delay devices.

11. A method as claimed in claim 10 comprising:
- comparing the first clock signal with the trigger signal output by the last connected delay device and generating an error signal responsive to said comparison; and
- using the error signal to control said predetermined time interval.

12. Clock generation circuitry for providing from a first clock signal a second clock signal at a different rate, the circuitry comprising:
- a plurality of sequentially connected delay devices, a first one of which is coupled to receive the first clock signal, each delay device being operable to cause a trigger signal and an output signal to be produced at a predetermined time interval after receiving a trigger signal from the previously connected delay device;
- control circuitry operable to provide a control signal in common to said delay devices for controlling said predetermined time interval; and
- output circuitry coupled to receive the output signals of the delay devices to produce therefrom said second clock signal, in which each delay device comprises:
- analogue timing circuitry including a controllable switch element responsive to a reset signal to change from a first to a second state, a capacitor connected to be charged up when said controllable switch element is in the first state, and a comparator connected to receive as a first input signal the voltage across the capacitor and as a second input signal a control voltage from said control circuitry and producing as an output a timing signal in dependence on said first and second input signals; and
- digital control circuitry connected to receive said timing signal and to provide in response thereto the trigger signal of the delay device and said reset signal thereby to achieve a substantially linear response of the predetermined time interval to the control circuitry.

13. Clock generation circuitry as claimed in claim 12 in which the control circuitry is connected in a feedback loop so as to be responsive to an error signal resulting from a comparison of the first clock signal with the trigger signal output by the last connected delay device.

* * * * *